(12) United States Patent
Ishii

(10) Patent No.: US 10,777,774 B2
(45) Date of Patent: Sep. 15, 2020

(54) LIGHT EMITTING ELEMENT, DISPLAY DEVICE, AND ELECTRONIC APPARATUS

(71) Applicant: Sony Semiconductor Solutions Corporation, Kanagawa (JP)

(72) Inventor: Yoshiyuki Ishii, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/497,128

(22) PCT Filed: Feb. 13, 2018

(86) PCT No.: PCT/JP2018/004874
§ 371 (c)(1),
(2) Date: Sep. 24, 2019

(87) PCT Pub. No.: WO2018/179927
PCT Pub. Date: Oct. 4, 2018

(65) Prior Publication Data
US 2020/0020886 A1 Jan. 16, 2020

(30) Foreign Application Priority Data
Mar. 31, 2017 (JP) .................................. 2017-071547

(51) Int. Cl.
*H01L 35/24* (2006.01)
*H01L 51/00* (2006.01)
(Continued)

(52) U.S. Cl.
CPC ...... *H01L 51/5275* (2013.01); *H01L 27/3244* (2013.01); *H01L 51/5256* (2013.01)

(58) Field of Classification Search
CPC ............ H01L 27/3244; H01L 51/5275; H01L 51/5256
(Continued)

(56) References Cited

U.S. PATENT DOCUMENTS

2012/0228603 A1* 9/2012 Nakamura .......... H01L 51/5234
257/40
2013/0214301 A1* 8/2013 Yamada .............. H01L 51/5262
257/88
(Continued)

FOREIGN PATENT DOCUMENTS

| JP | 2011-113968 A | 6/2011 |
|---|---|---|
| JP | 2013-191533 A | 9/2013 |

(Continued)

*Primary Examiner* — David S Blum
(74) *Attorney, Agent, or Firm* — Michael Best & Friedrich LLP

(57) ABSTRACT

A light emitting element and corresponding display device with improved light extracting efficiency are disclosed. In one example, a light emitting element includes a first electrode with a first member disposed on both sides to form a recess structure with the first electrode as a bottom. An organic light emitting layer is disposed along the recess structure on the first electrode and the first member, and a second electrode is disposed on the organic light emitting layer. A second member having a higher refractive index than the first member is disposed on the second electrode so as to embed the recess structure. Between the second electrode and the second member, a laminate barrier layer is formed of layers having different refractive indices and having, as the entire laminate, a refractive index between the refractive index of the second electrode and the refractive index of the second member.

11 Claims, 8 Drawing Sheets

(51) Int. Cl.
*H01L 51/52* (2006.01)
*H01L 27/32* (2006.01)

(58) Field of Classification Search
USPC .......................................................... 257/40
See application file for complete search history.

(56) References Cited

U.S. PATENT DOCUMENTS

2015/0123086 A1  5/2015  Lee et al.
2016/0149157 A1  5/2016  Cho et al.
2016/0380235 A1  12/2016 Kim et al.

FOREIGN PATENT DOCUMENTS

JP   2017-224416 A   12/2017
KR   10-1695652 B1   1/2017
KR   2017-0062786 A  6/2017
WO   2016/093009 A1  6/2016

\* cited by examiner

LIGHT EMITTING ELEMENT, DISPLAY DEVICE, AND ELECTRONIC APPARATUS

TECHNICAL FIELD

The present disclosure relates to a light emitting element, a display device, and an electronic apparatus.

BACKGROUND ART

In recent years, a lighting device or a display device using an organic electroluminescent element (so-called organic EL element) as a light emitting element is becoming widespread. In a light emitting element used in such a lighting device or display device, it is required to extract light more efficiently from a light emitting source in order to improve luminance.

For example, Patent Document 1 below discloses a display device that improves light extracting efficiency from an organic EL element by forming the organic EL element at a bottom of a recess structure and causing an inner side surface of the recess structure to function as a reflector due to a difference in refractive index.

CITATION LIST

Patent Document

Patent Document 1: Japanese Patent Application Laid Open No. 2013-191533

SUMMARY OF THE INVENTION

Problems to be Solved by the Invention

However, in the display device disclosed in Patent Document 1, layers constituting the light emitting element have different refractive indices from one another. Therefore, light emitted from the light emitting element may be reflected a plurality of times at interfaces between various layers. Therefore, in the display device disclosed in Patent Document 1, light extracting efficiency from the light emitting element may be reduced by unintended reflection.

Therefore, the present disclosure proposes a new and improved light emitting element, display device, and electronic apparatus that can further improve the light extracting efficiency.

Solutions to Problems

The present disclosure provides a light emitting element including: a first electrode; a first member disposed on both sides of the first electrode and forming a recess structure having the first electrode as a bottom; an organic light emitting layer including an organic light emitting material and disposed along the recess structure on the first electrode and the first member; a second electrode disposed on the organic light emitting layer; and a second member having a higher refractive index than the first member and disposed on the second electrode so as to embed the recess structure, in which between the second electrode and the second member, a barrier layer formed as a laminate of a plurality of layers having different refractive indices and having, as the entire laminate, a refractive index between the refractive index of the second electrode and the refractive index of the second member is disposed.

Furthermore, the present disclosure provides a display device including: a display unit having a plurality of light emitting elements arranged on a plane, each of the light emitting elements including: a first electrode; a first member disposed on both sides of the first electrode and forming a recess structure having the first electrode as a bottom; an organic light emitting layer including an organic light emitting material and disposed along the recess structure on the first electrode and the first member; a second electrode disposed on the organic light emitting layer; and a second member having a higher refractive index than the first member and disposed on the second electrode so as to embed the recess structure, in which between the second electrode and the second member, a barrier layer formed as a laminate of a plurality of layers having different refractive indices and having, as the entire laminate, a refractive index between the refractive index of the second electrode and the refractive index of the second member is disposed; and a display control unit that controls the display unit.

Moreover, the present disclosure provides an electronic apparatus including: a display unit having a plurality of light emitting elements arranged on a plane, each of the light emitting elements including: a first electrode; a first member disposed on both sides of the first electrode and forming a recess structure having the first electrode as a bottom; an organic light emitting layer including an organic light emitting material and disposed along the recess structure on the first electrode and the first member; a second electrode disposed on the organic light emitting layer; and a second member having a higher refractive index than the first member and disposed on the second electrode so as to embed the recess structure, in which between the second electrode and the second member, a barrier layer formed as a laminate of a plurality of layers having different refractive indices and having, as the entire laminate, a refractive index between the refractive index of the second electrode and the refractive index of the second member is disposed; and a control unit that controls the display unit.

According to the present disclosure, unintended light reflection at an interface between layers can be suppressed, and therefore light extracting efficiency from the light emitting element can be improved.

Effects of the Invention

As described above, the present disclosure can provide a light emitting element, a display device, and an electronic apparatus that have improved light extracting efficiency.

Note that the above effect is not necessarily limited. Any one of effects described in the present specification or another effect that can be grasped from the present specification may be exhibited together with the above effect or in place of the above effect.

MODE FOR CARRYING OUT THE INVENTION

Figure 1:
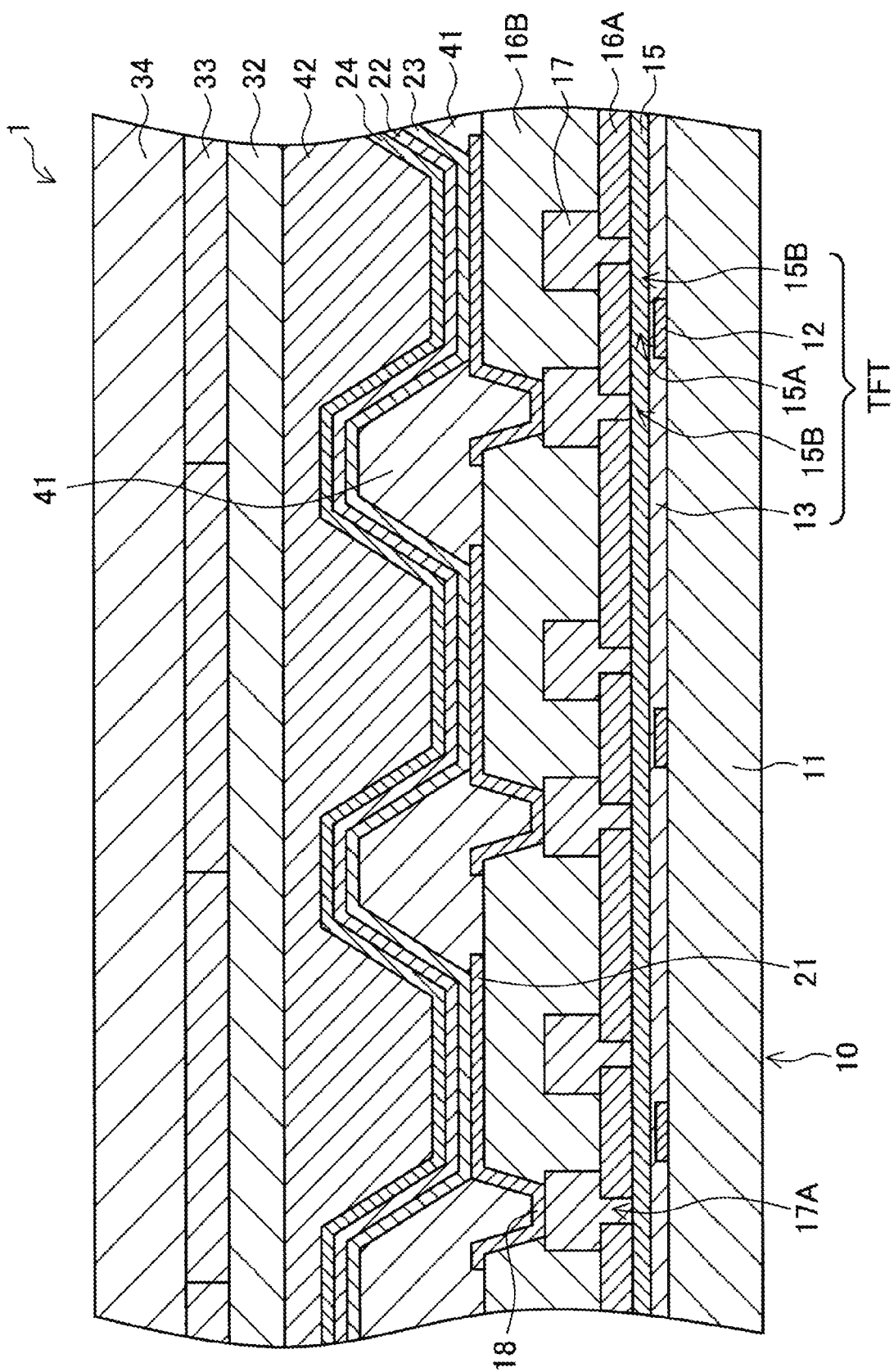
FIG. 1 is a cross-sectional view schematically illustrating a cross section obtained by cutting a display device according to an embodiment of the present disclosure is a lamination direction.

Preferable embodiments of the present disclosure will be described in detail below with reference to the accompanying drawings. Note that in the present specification and drawings, the same reference numerals are given to constituent elements having substantially the same functional configuration, and redundant explanation is omitted.

Note that the description will be made in the following order.
1. Configuration of display device
2. Configuration of light emitting element
3. Configuration of barrier layer
4. Manufacturing method
5. Application example <1. Configuration of Display Device>

First, with reference to FIG. 1, a configuration of a display device according to an embodiment of the present disclosure will be described. FIG. 1 is a cross-sectional view schematically illustrating a cross section obtained by cutting a display device according to an embodiment of the present disclosure in a lamination direction.

As illustrated in FIG. 1, a display device 1 includes: a plurality of transistor TFTs disposed on a first substrate 11; a plurality of light emitting elements 10 electrically connected to the transistor TFTs, respectively; a color filter layer 33 disposed on the plurality of light emitting elements 10 via a planarization layer 32; and a second substrate 34 disposed on the color filter layer 33. The display device 1 illustrated in FIG. 1 is a top emission type display device that extracts light from the light emitting elements 10 via the second substrate 34, but may be a bottom emission type display device that extracts light via the first substrate 11.

Note that in the following description, a lamination direction of layers in the display device 1 is expressed as a vertical direction. Furthermore, a direction in which the first substrate 11 is disposed is expressed as a lower direction, and a direction in which the second substrate 34 is disposed is expressed as an upper direction.

The first substrate 11 is constituted by, for example, a single crystal, polycrystalline, or amorphous silicon (Si) substrate. A substrate constituted by a semiconductor such as silicon is finely processed easily, and therefore easily forms the transistor TFTs and the light emitting elements 10 more finely.

The transistor TFTs are disposed corresponding to the respective light emitting elements 10, and control driving of the respective light emitting elements 10. Specifically, by selectively driving an arbitrary light emitting element 10 by the transistor TFT, light is emitted from the driven light emitting element 10, and a desired image, character, or the like is displayed on the display device 1.

For example, the transistor TFT may be a thin film transistor (TFT). In such a case, the transistor TFT may include: a gate electrode 12 disposed on the first substrate 11; a gate insulating film 13 disposed on the first substrate 11 and the gate electrode 12; and a semiconductor layer 15 disposed on the gate insulating film 13. According to this configuration, in the semiconductor layer 15, a region located immediately above the gate electrode 12 functions as a channel region 15A, and a region located so as to sandwich the channel region 15A functions as a source/drain region 15B. Note that FIG. 1 illustrates a bottom gate type transistor TFT, but the transistor TFT may be a top gate type. Materials constituting these layers may be known materials.

Furthermore, a lower insulating layer 16A and an upper insulating layer 16B are disposed as upper layers of the semiconductor layer 15. The lower insulating layer 16A has an opening in a region immediately above the source/drain region 15B, and a contact 17A is disposed so as to embed the opening. Moreover, wiring 17 is disposed on the contact 17A, and the upper insulating layer 16B is disposed so as to embed the wiring 17 and the transistor TFT.

The upper insulating layer 16B has an opening in a region where the wiring 17 is disposed, and connection wiring 18 is disposed so as to be electrically connected to the wiring 17 via the opening. Furthermore, the connection wiring 18 is also extended on the upper insulating layer 16B and functions as a first electrode 21 of the light emitting element 10. As a result, in the light emitting element 10, the first electrode 21 is electrically connected to the wiring 17 via the connection wiring 18 to be electrically connected to the source/drain region 15B of the transistor TFT.

Note that the contact 17A, the wring 17, the connection wiring 16, and the like can contain a metal such as copper (Cu), aluminum (Al), gold (Au), platinum (Pt), titanium (Ti), chromium (Cr), or tungsten (W), or an alloy thereof. Furthermore, the lower insulating layer 16A and the upper insulating layer 16B can be formed by using a silicon oxide ($SiO_x$)-based material (for example, $SiO_2$, BPSG, PSG, BSG, AsSG, PbSG, PbSG, SiON, SOG, low melting point glass, glass paste, or the like), a silicon nitride ($SiN_x$)-based material, a silicon oxynitride (SiON)-based material, or an insulating resin (for example, a polyimide resin, a novolac-based resin, an acrylic resin, polybenzoxazole, or the like) singly or combining a plurality types thereof. Note that these configurations can be formed appropriately using a known material other than the materials described above.

The light emitting element 10 is disposed on the upper insulating layer 16B having the transistor TFT or the like embedded therein, and includes, for example, the first electrode 21, the organic light emitting layer 23 disposed on the first electrode 21, and the second electrode 22 disposed on the organic light emitting layer 23. The light emitting element 10 emits light by application of an electric field to the organic light emitting layer 23 sandwiched between the first electrode 21 and the second electrode 22. Furthermore, a barrier layer 24 is disposed on the second electrode 22 in order to protect the light emitting element 10 (in particular, the organic light emitting layer 23) from oxygen and moisture in air.

The light emitting element 10 is disposed inside a recess structure having the first member 41 as a side wall and having the first electrode 21 as a bottom, and the recess structure is embedded by the second member 42. As a result, the second member 42 functions as a layer that propagates light emitted from the light emitting element 10 upward. Note that specific configurations of the light emitting element 10 and the barrier layer 24 will be described later with reference to FIG. 2.

Here, the first member 41 and the second member 42 each contain a material in which a refractive index $n_1$ of the first member 41 and a refractive index $n_2$ of the second member 42 satisfy a relationship of $n_2 > n_1$. As a result, light that has been propagated through the second member 42 is reflected on a surface of the first member 41 facing the second member 42. Therefore, the surface of the first member 41 facing the second member 42 functions as a reflector (light reflecting portion).

Furthermore, the recess structure in which the light emitting element 10 is disposed has a reverse tapered shape inclined such that the opening area on the side of the first electrode 21 is reduced. Therefore, light emitted from the light emitting element 10 is reflected upward at an interface between the first member 41 and the second member 42. According to such a configuration, the display device 1 can improve light extracting efficiency from the light emitting element 10, and therefore can improve luminance as the entire display device 1.

The planarization layer 32 is disposed on the second member 42 and planarizes unevenness generated by a structure disposed below the second member 42. For example, the planarization layer 32 may be formed by forming a film of $SiO_x$, $SiN_x$, or the like and then polishing a surface thereof by chemical mechanical polish (CMP) or the like to planarize the surface.

The color filter layer 33 is disposed on the planarization layer 32. Specifically, the color filter layer 33 is disposed such that color filters corresponding to the light emitting elements 10 are arranged in a predetermined manner. For example, the color filter layer 33 may be disposed such that a red color filter, a green color filter, and a blue color filter each having a predetermined area are distributed on a plane in a predetermined arrangement manner. In other words, the display device 1 illustrated in FIG. 1 is a so-called on-chip color filter (OCCF) type display device in which the color filter layer 33 is disposed on the first substrate 11 on which the light emitting elements 10 are disposed. Furthermore, the color filter layer 33 may contain a black matrix that shields light from the light emitting elements 10 as necessary.

The second substrate 34 is disposed on the color filter layer 33 via a sealing resin such as an epoxy resin. The second substrate 34 may contain, for example, quartz glass, but may contain high strain point glass, soda glass (mixture of $Na_2O$, CaO, and $SiO_2$), borosilicate glass (mixture of $Na_2O$, $B_2O_3$, and $SiO_2$), forsterite ($Mg_2SiO_4$), lead glass (mixture of $Na_2O$, PbO, and $SiO_2$), quartz, or an organic resin (for example, polymethyl methacrylate (PMA), polyvinyl alcohol (PVA), polyvinyl phenol (PVP), polyether sulfone (PES), polyimide, polycarbonate, polyethylene terephthalate (PET), or the like), and may contain another known material. However, the second substrate 34 preferably contains a material having a high light transmittance that can suitably transmit light from the light emitting elements 10. Furthermore, as the sealing resin, a material having high light transmittance with respect to light emitted from the light emitting elements 10 is preferably used.

<2. Configuration of Light Emitting Element>

Figure 2:
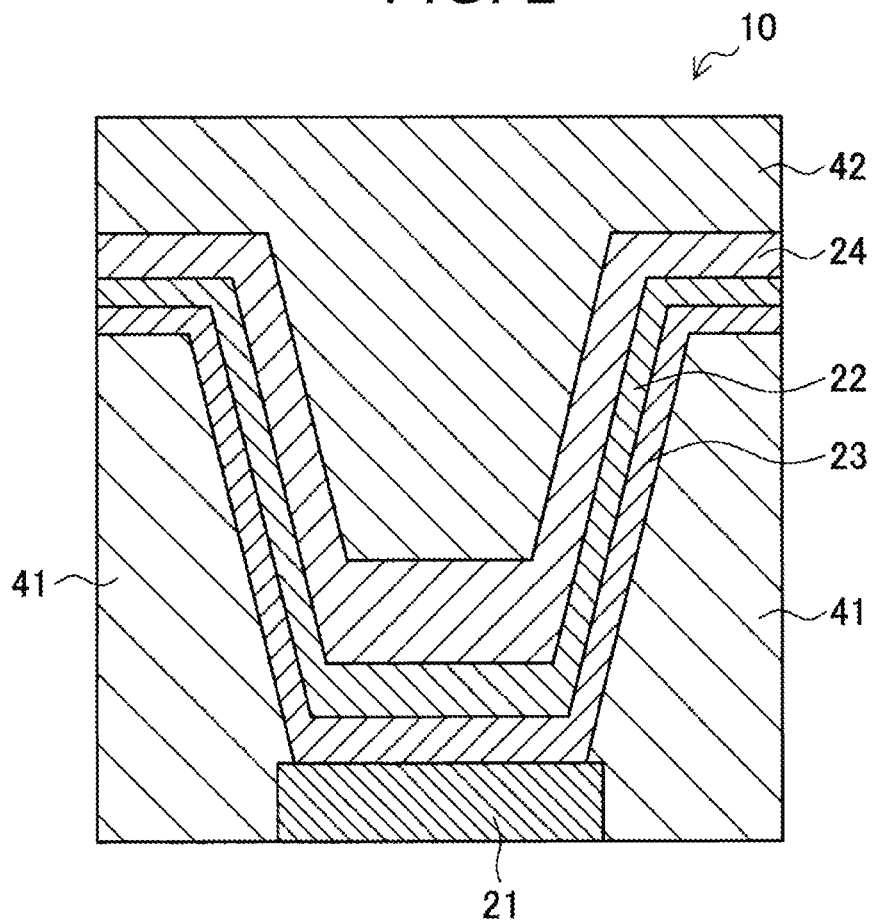
FIG. 2 is a schematic cross-sectional view enlarging a region in which the light emitting element of FIG. 1 is disposed.

Next, with reference to FIG. 2, the light emitting element 10 disposed in the display device 1 according to the preset embodiment will be described in more detail. FIG. 2 is a schematic cross-sectional view enlarging a region in which the light emitting element 10 of FIG. 1 is disposed.

As illustrated in FIG. 2, the light emitting element 10 includes the first electrode 21, the first member 41 forming a recess structure having the first electrode 21 as a bottom, the organic light emitting layer 23 disposed along the recess structure formed by the first electrode 21 and the first member 41, and the second electrode 22 disposed on the organic light emitting layer 23. Furthermore, the barrier layer 24 is disposed on the second electrode 22, and the recess structure formed by the first electrode 21 and the first member 41 is embedded by the second member 42 from above the barrier layer 24.

As described above, the light emitting element 10 is formed inside the recess structure having the first member 41 disposed between the light emitting elements 10 as a side wall and having the first electrode 21 as a bottom. Furthermore, the recess structure is embedded by the second member 42, and the refractive index $n_2$ of the second member 42 is larger than the refractive index $n_1$ of the first member 41. Therefore, a surface of the first member 41 facing the second member 42 can function as a reflector that reflects light that has been propagated through the second member 42.

Moreover, the recess structure in which the light emitting element 10 is disposed has a reverse tapered shape in which an opening is expanded toward the side of the second substrate 34. Therefore, light emitted from the light emitting element 10 is reflected upward at an interface between the first member 41 and the second member 42. According to such a configuration, light extracting efficiency from the light emitting element 10 can be improved.

The first electrode 21 is disposed for each of the light emitting elements 10, and functions as an anode of each of the light emitting elements 10. Furthermore, the first electrode 21 is disposed at a bottom of the recess structure having the first member 41 as a side wall. As described above, the display device 1 is a top emission type. Therefore, the first electrode 21 is preferably formed as a light reflection electrode that reflects light emitted from the organic light emitting layer 23 using a material having a high light reflectance.

For example, the first electrode 21 may contain a simple substance of a metal having a high work function, such as platinum (Pt), gold (Au), silver (Ag), chromium (Cr), tungsten (W), nickel (Ni), copper (Cu), iron (Fe), cobalt (Co), or tantalum (Ta), an alloy thereof, or the like. Furthermore, the first electrode 21 may be formed as a laminated electrode obtained by laminating a transparent conductive material such as indium zinc oxide (IZO) or indium tin oxide (ITO) on a dielectric multilayer film or a thin film with high light reflectance such as aluminum.

The organic light emitting layer 23 contains an organic light emitting material, and is disposed on the first electrode 21 and the first member 41 along the recess structure as a continuous film reaching the plurality of light emitting elements 10. The organic light emitting layer 23 can emit light by application of an electric field between the first electrode 21 and the second electrode 22.

Specifically, in a case where an electric field is applied to the organic light emitting layer 23, into the organic light emitting layer 23, a hole is injected from the first electrode 21, and an electron is injected from the second electrode 22. The injected hole and electron recombine in the organic light emitting layer 23 to form an exciton, and energy of the formed exciton excites an organic light emitting material to generate fluorescence or phosphorescence from the organic light emitting material.

Here, the organic light emitting layer 23 may have a multilayer structure obtained by laminating a plurality of functional layers. For example, the organic light emitting layer 23 may have a multilayer structure formed by sequentially laminating a hole injection layer, a hole transport layer, a light emitting layer, an electron transport layer, and an electron injection layer from the side of the first electrode 21. Furthermore, the organic light emitting layer 23 may have a so-called tandem structure in which a plurality of light emitting layers is connected to one another via a charge generation layer or an intermediate electrode.

The hole injection layer is a layer that contains a hole injection material and enhances injection efficiency of a hole from the first electrode 21. The hole injection material may be a known one, and examples thereof include triphenylamine-containing polyether ketone (TPAPEK), 4-isopropyl-4'-methyldiphenyliodonium tetrakis (pentafluorophenyl) borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4''-tris(3-methylphenylphenylamino) triphenylamine (m-MTDATA), N,N'-di(1-naphthyl)-N,N'-diphenylbenzidine (NPB), 4,4',4''-tris(diphenylamino) triphenylamine (TDATA), 4,4',4''-tris(N,N-2-naphthylphenylamino) triphenylamine (2-TNATA), and the like.

The hole transport layer is a layer that contains a hole transport material and enhances transport efficiency of a hole from the first electrode 21. The hole transport material may be a known one, and examples thereof include benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, derivatives thereof, and the like.

More specific examples of the hole transport material include α-naphthylphenylphenylenediamine (α-NPD), porphyrin, metal tetraphenylporphyrin, metal naphthalocyanine, hexacyanoazatriphenylene (HAT), 7,7,8,8-tetracyanoquinodimethane (TCNQ), 7,7,8,8-tetracyano-2,3,5,6-tetrafluoroquinodimethane (F4-TCNQ), tetracyano 4,4,4-tris(3-methylphenylphenylamino) triphenylamine, N,N,N',N'-tetrakis(p-tolyl) p-phenylenediamine, N,N,N',N'-tetraphenyl-4,4'-diaminobiphenyl, N-phenylcarbazole, 4-di-p-tolylamino stilbene, and the like.

The light emitting layer is a layer that contains at least one charge transport material selected from a hole transport material, an electron transport material, and a both charge transport material as a host material, and a fluorescent or phosphorescent organic light emitting material as a dopant material, and converts electric energy into light energy.

The host material may be a known charge transport material, and examples thereof include a styryl derivative, an anthracene derivative, a naphthacene derivative, a carbazole derivative, an aromatic amine derivative, a phenanthroline derivative, a triazole derivative, a quinolinolato-based metal complex, a phenanthroline derivative, and the like.

Furthermore, the dopant material (organic light emitting material) may be a known fluorescent material or phosphorescent material. Examples of the known fluorescent material include a dye material such as a styryl benzene-based dye, an oxazole-based dye, a perylene-based dye, a coumarin-based dye, or an acridine-based dye, a polyaromatic hydrocarbon-based material such as an anthracene derivative, a naphthacene derivative, a pentacene derivative, or a chrysene derivative, a pyrromethene skeleton material, a quinacridone-based derivative, a cyanomethylenepyran-based derivative, a benzothiazole-based derivative, a benzimidazole-based derivative, a metal chelated oxinoid compound, and the like. Furthermore, examples of the known phosphorescent material include an organometallic complex containing at least one metal selected from the group consisting of ruthenium (Ru), rhodium (Rh), palladium (Pd), silver (Ag), rhenium (Re), osmium (Os), iridium (Ir), platinum (Pt), and gold (Au). Specific examples of the phosphorescent material include a complex having a noble metal element such as Ir as a central metal, such as $Ir(ppy)_3$, a complex such as $Ir(bt)_2.acac_3$, and a complex such as $PtOEt_3$.

Furthermore, the light emitting layer may emit light corresponding to each color of the display device in place of white. For example, a red light emitting layer that emits red light can be formed by mixing 30% by mass of 2,6-bis[(4'-methoxydiphenylamino) styryl]-1,5-dicyanonaphthalene (BSN) with 4,4-bis(2,2-diphenylvinin) biphenyl (DPVBi) Furthermore, a green light emitting layer that emits green light can be formed by mixing 5% by mass of coumarin 6 with DPVBi. Moreover, a blue light emitting layer that emits blue light can be formed by mixing 2.5% by mass of 4,4'-bis[2-{4-(N,N-diphenylamino) phenyl} vinyl] biphenyl (DPAVBi) with DPVBi.

The electron transport layer is a layer that contains an electron transport material and enhances injection efficiency of an electron from the second electrode 22.

The electron transport material may be a known one, and examples thereof include tris(8-quinolinolato) aluminum ($Alq_3$), a compound having a nitrogen-containing aromatic ring, and the like. More specific examples of the electron transport material include the above tris(8-quinolinolato) aluminum ($Alq_3$), 2,9-dimethyl-4,7-diphenyl-1,10-phenanthroline (BCP), and bathophenanthroline (Bphen). Note that the electron transport layer may be constituted by a plurality of layers. In a case where the electron transport layer is constituted by a plurality of layers, the electron transport layer may contain a layer further doped with an alkali metal element or an alkaline earth metal element.

The electron injection layer is a layer that enhances injection efficiency of an electron from the second electrode 22. The electron injection layer may contain a known one, and may contain, for example, lithium fluoride (LiF), sodium chloride (NaCl), cesium fluoride (CsF), lithium oxide ($Li_2O$) barium oxide (BaO), or the like.

The second electrode 22 functions as a cathode of the light emitting elements, and is disposed on the organic light emitting layer 23 along the recess structure as a continuous film reaching the plurality of light emitting elements. As described above, the display device 1 is a top emission type. Therefore, the second electrode 22 is preferably formed as a transparent electrode that transmits light emitted from the organic light emitting layer 23 using a material having a high light transmittance.

For example, the second electrode 22 may contain a metal or an alloy having a low work function, such as aluminum (Al), silver (Ag), magnesium (Mg), calcium (Ca), sodium (Na), strontium (Sr), an alloy of an alkali metal and silver, an alloy of an alkaline earth metal and silver, an alloy of magnesium and calcium, or an alloy of aluminum and lithium. Furthermore, the second electrode 22 may contain a transparent conductive material such as indium zinc oxide (IZO) or indium tin oxide (ITO), and may be formed as a laminated electrode including a layer containing the above-described material having a low work function, and a layer containing a transparent conductive material such as indium zinc oxide (IZO) or indium tin oxide (ITO).

The first member 41 is disposed between the first electrodes 21 to separate the light emitting elements 10 from each other. Specifically, the first member 41 is formed around the first electrode 21 in a substantially trapezoidal shape (in other words, a tapered shape) having an inclined portion. As a result, the first member 41 can form a recess structure in which an opening area increases toward the second substrate 34 (in other words, having a reverse tapered shape) with the first electrode 21 as a bottom.

The first member 41 preferably contains a material having a smaller refractive index than the second member 42. The first member 41 may contain, for example, an organic insulating material such as a polyimide-based resin, an acrylic resin, or a novolac-based resin, an inorganic insulating material such as silicon oxide (SiO), silicon nitride ($SiN_x$), or silicon oxynitride (SiON), or the like.

The second member 42 is disposed on the barrier layer 24 so as to embed the recess structure formed by the first member 41. The second member 42 preferably contains a material having a larger refractive index than the first member 41. As a result, the second member 42 can cause a surface of the first member 41 facing the second member 42 to function as a reflector that reflects at least a part of light that has been propagated through the second member 42.

The second member 42 may contain, for example, a transparent organic insulating material such as a polyimide-based resin, an acrylic resin, or a novolac-based resin, a transparent inorganic insulating material such as silicon oxide ($SiO_x$), silicon nitride ($SiN_x$), or silicon oxynitride (SiON), or the like. Note that examples of the material having a high refractive index for forming the second member 42 include an organic resin having a large number of substituents with high molecular refraction, such as a sulfur-containing substituent, a phosphorus-containing substituent, or an aromatic ring, in a molecular structure thereof, an inorganic oxide having a high refractive index, such as ITO, IZO, $TiO_2$, or $Nb_2O_5$, and the like. Furthermore, the high refractive index second member 42 can also be formed by adding a high refractive index inorganic filler such as $TiO_2$ or $ZrO_2$ to the second member 42.

The barrier layer 24 is a layer that is disposed on the second electrode 22 and prevents moisture and oxygen from entering the organic light emitting layer 23. In the present embodiment, the refractive index of the barrier layer 24 is controlled so as to be a value between the refractive index of the second electrode 22 and the refractive index of the second member 42. As a result, the barrier layer 24 can prevent occurrence of a large change in refractive index between the second electrode 22 disposed under the barrier layer 24 and the second member 42 disposed on the barrier layer 24. As a result, the barrier layer 24 can suppress occurrence of unintended reflection of light emitted from the light emitting element 10.

Specifically, the barrier layer 24 having such a controlled refractive index can be formed as a laminate of a plurality of layers having different refractive indices. This is because in a case where the film thickness of each layer of the laminate constituting the barrier layer 24 is extremely small with respect to the wavelength of incident light (for example, in a case of 1/50 or less of the wavelength of the incident light), the incident light hardly interacts with each layer of the laminate. In such a case, the barrier layer 24 acts as if the entire barrier layer 24 is a single layer film with respect to the incident light. Note that the refractive index of the entire barrier layer 24 at this time is a value obtained by averaging the refractive indices of the layers of the laminate constituting the barrier layer 24 with a film thickness ratio.

Therefore, in the barrier layer 24 formed as a laminate of a plurality of layers having different refractive indices, the refractive index of the entire barrier layer 24 can be arbitrarily controlled with the refractive index and the film thickness of each layer constituting the laminate. According to this, the barrier layer 24 controls the refractive index in accordance with the refractive index of the second electrode 22 disposed thereunder and the refractive index of the second member 42 disposed thereon, and can thereby suppress reflection of light. Therefore, the barrier layer 24 according to the present embodiment can suppress unintended reflection of light emitted from the light emitting element 10 at an interface between layers, and therefore can improve the light extracting efficiency of the light emitting element 10.

Furthermore, by forming the barrier layer 24 as a laminate of a plurality of layers, a barrier property against moisture and oxygen can also be improved. Although a detailed reason is not clear, it is considered that this is because by laminating a plurality of different layers, crystallization of the layers is suppressed, and therefore generation of a grain boundary serving as a passage of gas molecules and the like or a crystal defect is suppressed. Furthermore, it is considered that this is because by laminating a plurality of different layers, a dense composite compound in which materials constituting the layers are composite is generated at an interface between the layers, and therefore the denseness of the barrier layer 24 is improved.

Note that the barrier layer 24 may be formed as a laminate of two types of layers having different refractive indices, or may be formed as a laminate of three or more types of layers having different refractive indices.

<3. Configuration of Barrier Layer>

Figure 3:
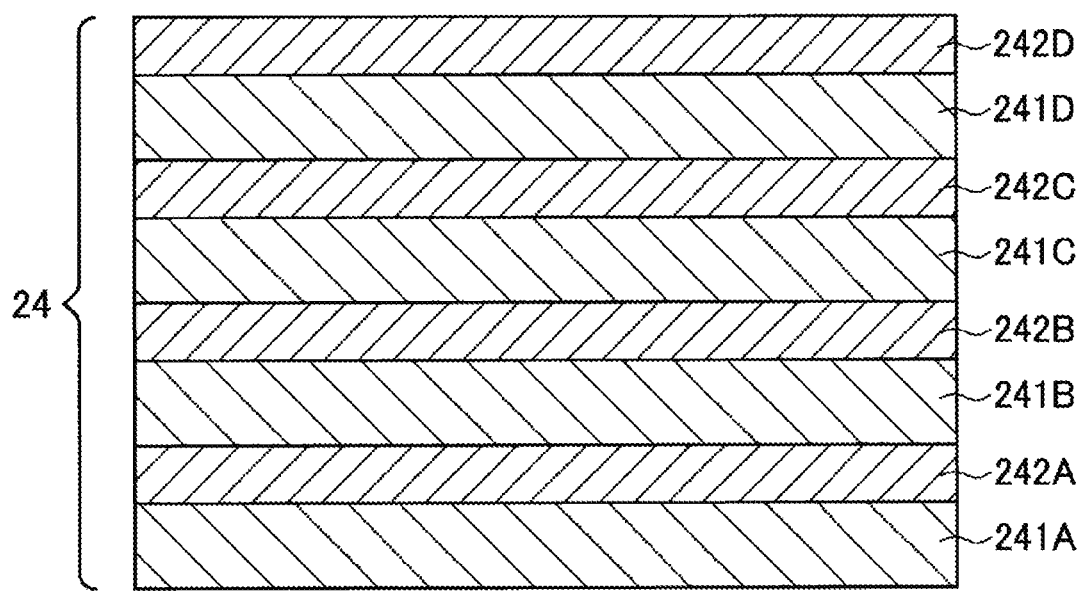
FIG. 3 is a schematic cross-sectional view illustrating a more specific configuration of a barrier layer.

Subsequently, the configuration of the above-described barrier layer 24 will be described in more detail with reference to FIG. 3. FIG. 3 is a schematic cross-sectional view illustrating a more specific configuration of the barrier layer 24.

As illustrated in FIG. 3, for example, the barrier layer 24 can be formed by repeatedly and alternately laminating two types of layers having different refractive indices. Specifically, the barrier layer 24 may be formed as a laminate obtained by alternately laminating protective layers 241A, 241B, 241C, and 241D (hereinafter collectively referred to as protective layer 241) containing a material having a high barrier property against moisture and oxygen and refractive index adjusting layers 242A, 242B, 242C, and 242D (hereinafter collectively referred to as refractive index adjusting layer 242) containing a material having a high refractive index. Note that FIG. 3 illustrates a structure in which two types of layers are alternately and repeatedly laminated four times as the barrier layer 24, but the present embodiment is not limited thereto. The number of repetitions of laminating the barrier layer 24 only needs to be at least one. Furthermore, an upper limit of the number of repetitions of lamination is not particularly limited.

The protective layer 241 and the refractive index adjusting layer 242 contain inorganic materials containing different types of elements from each other, and a difference between the refractive index of the protective layer 241 and the refractive index of the refractive index adjusting layer 242 may be 0.1 or more. By forming the protective layer 241 and the refractive index adjusting layer 242 with materials having different properties from each other, the barrier layer 24 easily optimizes a barrier property of the entire barrier layer 24 against moisture and oxygen and a refractive index thereof.

Specific examples of the material having a high barrier property against moisture and oxygen to form the protective layer 241 include $Al_2O_3$, $SiN_x$, $SiO_2$, SiON, SiC, SiCO, and the like. Furthermore, specific examples of the material having a high refractive index to form the refractive index adjusting layer 242 include a metal oxide, and examples thereof include $TiO_2$, $ZrO_2$, ZnO, $Ta_2O_5$, $HfO_2$, and $Nb_2O_5$. By using such a material, the barrier layer 24 can control a refractive index thereof to an arbitrary value by the refractive index adjusting layer 242 while securing a barrier property against moisture and oxygen by the protective layer 241.

Here, either the film thickness of the protective layer 241 or the film thickness of the refractive index adjusting layer 242 is preferably 10 nm or less. As described above, in order to make the barrier layer 24 act as if the entire barrier layer 24 is one layer with respect to incident light, the film thickness of the protective layer 241 or the refractive index adjusting layer 242 is preferably negligibly small with respect to the wavelength of incident light (approximately 360 nm to 830 nm). Therefore, either the film thickness of the protective layer 241 or the film thickness of the refractive index adjusting layer 242 is preferably 10 nm or less.

Note that a ratio between the film thickness of the protective layer 241 and the film thickness of the refractive index adjusting layer 242 in a repeating unit may be any ratio as long as the film thickness of each of the layers falls within the above-described range. Furthermore, the ratio between the film thickness of the protective layer 241 and the film thickness of the refractive index adjusting layer 242 in a repeating unit may vary depending on a repeating unit.

Furthermore, the total film thickness of the repeating unit including the protective layer 241 and the refractive index adjusting layer 242 is preferably 24 nm or less. The barrier layer 24 is formed as a laminate obtained by further laminating the repeating unit including the protective layer 241 and the refractive index adjusting layer 242. Therefore, the total film thickness of the repeating unit including the protective layer 241 and the refractive index adjusting layer 242 is preferably small with respect to the wavelength of incident light (approximately 360 nm to 830 nm), and is preferably 24 nm or less from the results illustrated in FIG. 6 as described later. In a case where the total film thickness of the repeating unit including the protective layer 241 and the refractive index adjusting layer 242 is more than 24 nm, the barrier layer 24 acts as a laminate of a plurality of layers with respect to incident light to increase reflection of light. Therefore, this case is not preferable.

For example, in a case where the second electrode 22 contains indium zinc oxide (IZO) and the second member 42 contains silicon nitride ($SiN_x$), the barrier layer 24 may be formed as a laminate obtained by alternately laminating the protective layer 241 containing $Al_2O_3$ with a film thickness of 7 nm or more and 15 nm or less and the refractive index adjusting layer 242 containing $TiO_2$ with a film thickness of 0.5 nm or more and 5 nm or less.

Figure 4:
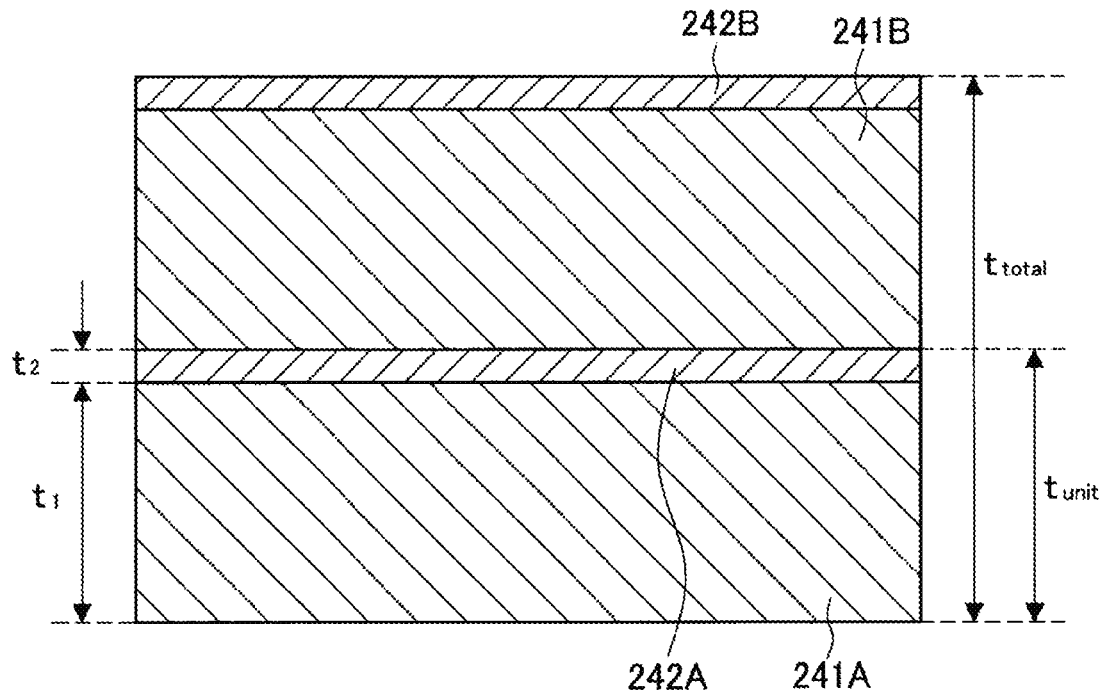
FIG. 4 is a schematic cross-sectional view for explaining a laminated structure of a barrier layer according to a test example.

Here, with reference to FIGS. 4 to 6, control of the refractive index in the barrier layer 24 will be described using a test example. FIG. 4 is a schematic cross-sectional view for explaining a laminated structure of the barrier layer 24 according to a test example.

As illustrated in FIG. 4, the barrier layer 24 according to a test example is formed as a laminate obtained by alternately laminating the protective layers 241A and 241B containing $Al_2O_3$ and the refractive index adjusting layers 242A and 242B containing $TiO_2$ repeatedly twice. Note that atomic layer deposition (ALD) was used to form the protective layers 241A and 241B and the refractive index adjusting layers 242A and 242B.

Furthermore, the film thickness of each of the protective layers 241A and 241B was represented by $t_1$, the film thickness of each of the refractive index adjusting layers 242A and 242B was represented by $t_2$, the film thickness of the repeating unit including the protective layer 241A and the refractive index adjusting layer 242A (in other words, $t_1+t_2$) was represented by $t_{unit}$, and the film thickness of the entire barrier layer 24 was represented by $t_{total}$.

First, by changing the ratio of each of $t_1$ and $t_2$ while the thickness $t_{unit}$ of the repeating unit was set to 10 nm and the film thickness $t_{total}$ of the entire barrier layer 24 was set to 20 nm, it was confirmed that the refractive index of the entire barrier layer 24 could be controlled. FIG. 5 illustrates results thereof. FIG. 5 is a graph illustrating an effective refractive index of the barrier layer 24 in a case where the ratio of the refractive index adjusting layer 242 containing $TiO_2$ is changed (note that the wavelength of incident light is 550 nm).

Here, the effective refractive index of the barrier layer 24 was calculated using spectroscopic ellipsometry. Spectroscopic ellipsometry is a measurement method that can calculate an optical constant of a sample from a change in polarization of reflected light with respect to polarization of incident light with which the sample has been irradiated by giving a film configuration model of the sample. In FIG. 5, as the film configuration model of the barrier layer 24, by using a film configuration model in a case of assuming that the barrier layer 24 is a single layer film without using an actual film configuration of the laminate, the refractive index of the entire barrier layer 24 was calculated as the effective refractive index.

Note that in spectral ellipsometry, a least square error is also calculated which indicates a fitting error between a measured value and a value calculated from a given film configuration model of a sample. A case where the least square error is large indicates that consistency between the actual film configuration of a sample and the given film configuration model of the sample is low. In other words, in a case where the least square error of the barrier layer 24 formed as the laminate is large, an interaction occurs between layers of the laminate constituting the barrier layer 24 and incident light, and it can be seen that the barrier layer 24 does not act as a single layer film with respect to the incident light.

Figure 5:
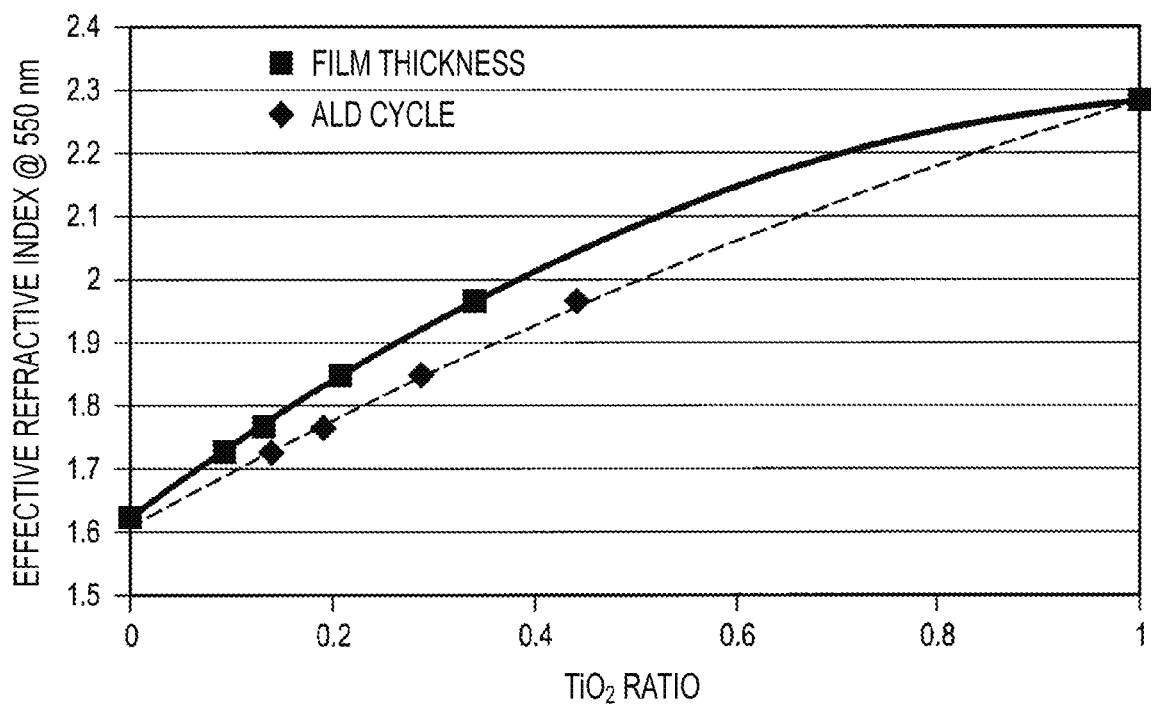
FIG. 5 is a graph illustrating an effective refractive index of a barrier layer in a case where the ratio of a refractive index adjusting layer containing $TiO_2$ is changed.

In FIG. 5, a case where the ratio of the refractive index adjusting layer 242 containing $TiO_2$ is varied depending on a film thickness is indicated by a square point plot, and a case where the ratio of the refractive index adjusting layer 242 containing $TiO_2$ is varied depending on the number of film formation cycles by ALD is indicated by a diamond point plot. Since ALD can form a film of atoms layer by layer, it is considered that the number of film formation cycles by ALD corresponds to the number of crystal lattices of a formed layer. In both the results illustrated in FIG. 5, it was confirmed that the least square error of spectral ellipsometry was small, and that the barrier layer 24 acted as a single layer film with respect to incident light.

Referring to FIG. 5, it can be seen that as the ratio of $TiO_2$ having a higher refractive index than $Al_2O_3$ increases, the refractive index of the entire barrier layer 24 also increases. Note that a case where the $TiO_2$ ratio is 0 is a case where the barrier layer 24 is formed as a single layer film of $Al_2O_3$, and a case where the $TiO_2$ ratio is 1 is a case where the barrier layer 24 is formed as a single layer film of $TiO_2$. Therefore, it can be seen that the refractive index of the entire barrier layer 24 is an intermediate value among the refractive indices of layers to be laminated. Furthermore, the ratio of $TiO_2$ calculated from the film formation cycle of ALD has higher linearity with respect to the refractive index of the entire barrier layer 24 than the ratio of $TiO_2$ calculated from the film thickness of the refractive index adjusting layer 242. Therefore, it can be seen that the number of crystal lattices is more important than the film thickness for controlling the refractive index in an extremely thin film.

Next, by fixing $t_2/(t_1+t_2)$ to approximately 0.1 and changing the film thickness $t_{unit}$ of the repeating unit, the film thickness of each layer of the laminate in which the barrier layer 24 could be regarded as a single layer film was examined. FIG. 6 illustrates results thereof. FIG. 6 is a graph illustrating a least square error of a spectroscopic ellipsometer in a case where the film thickness $t_{unit}$ of the repeating unit is changed. Note that a case where the film thickness $t_{unit}$ of the repeating unit is 0 nm indicates a case where the barrier layer 24 is a single layer film of $Al_2O_3$.

Figure 6:
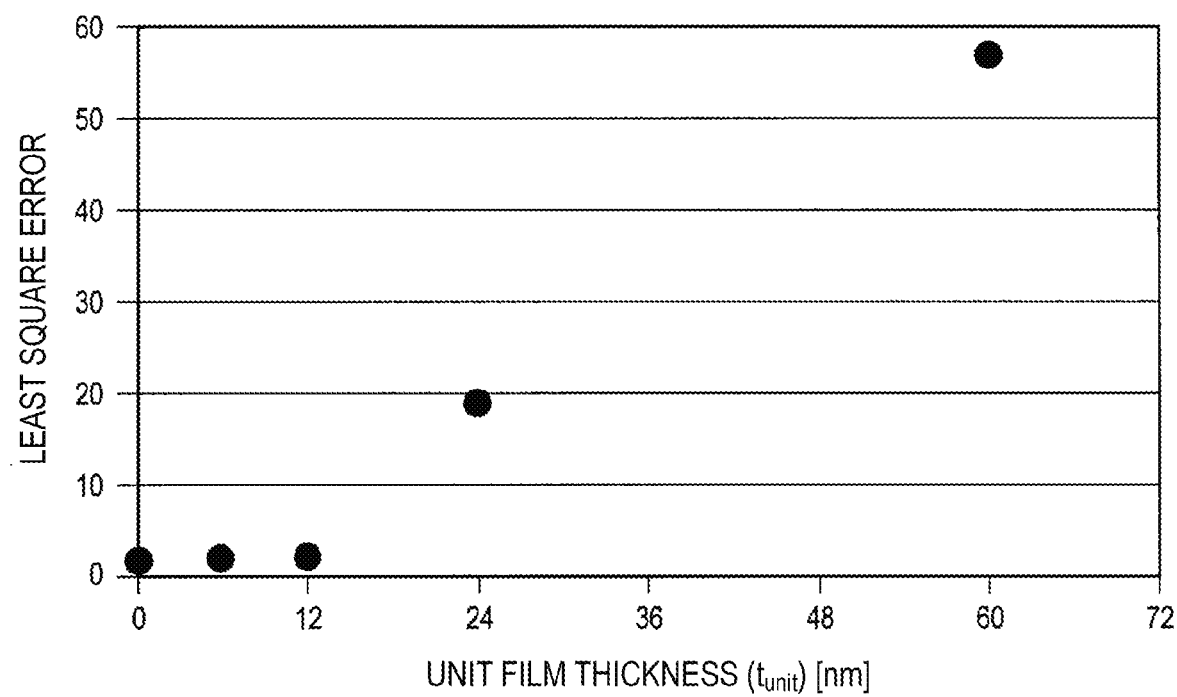
FIG. 6 is a graph illustrating a least square error of a spectroscopic ellipsometer in a case where a film thickness $t_{unit}$ of a repeating unit is changed.

As illustrated in FIG. 6, in a case where the film thickness $t_{unit}$ of the repeating unit is 24 nm, it can be seen that the least square error by spectral ellipsometry increases sharply. Meanwhile, when the film thickness $t_{unit}$ of the repeating unit is about 12 nm or less, the least square error is almost similar to that in the case where the barrier layer 24 is a single layer film, and therefore the barrier layer 24 formed as a laminate of a plurality of layers can be regarded as a single layer film. Therefore, it can be seen that the total film thickness of the repeating unit of the barrier layer 24 is preferably 24 nm or less.

As can be seen from the above results, in the light emitting element 10 according to the present embodiment, by forming the barrier layer as a laminate of a plurality of layers having different refractive indices, unintended reflection of light in the light emitting element 10 can be suppressed. According to this, light directed upward from the light emitting element 10 can be increased, and therefore light extracting efficiency from the light emitting element 10 can be improved.

<4. Manufacturing Method>

Next, a method for manufacturing the light emitting element 10 according to the present embodiment will be described with reference to FIGS. 7 to 11. FIGS. 7 to 11 are cross-sectional views schematically illustrating steps of the method for manufacturing the light emitting element 10 according to the present embodiment.

Figure 7:
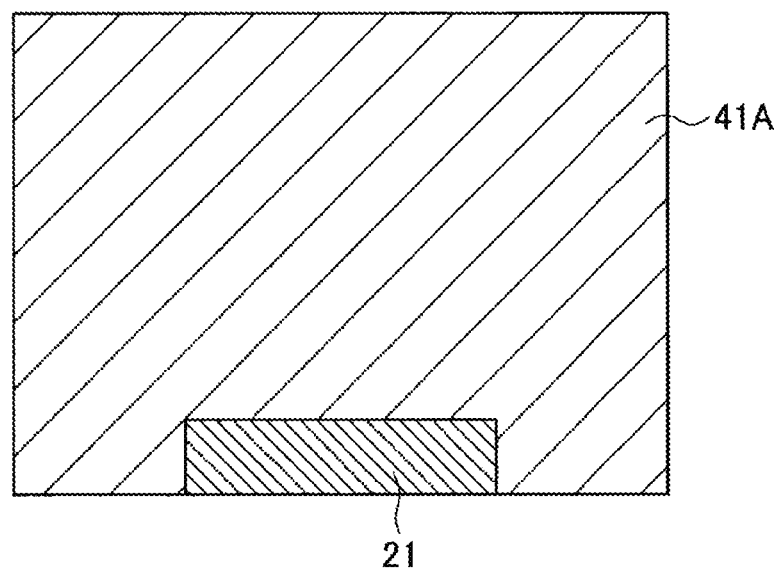
FIG. 7 is a cross sectional view schematically illustrating one step of a method for manufacturing the light emitting element according to the embodiment.

First, as illustrated in FIG. 7, the first electrode 21 is formed, and then the first member layer 41A is formed on the first electrode 21.

Specifically, first, the first electrode 21 to be electrically connected to various circuits including a transistor TFT is formed using sputtering or the like. The first electrode 21 may contain an aluminum copper alloy (AlCu), and may be formed as a multilayer film obtained by sequentially laminating an aluminum copper alloy (AlCu) and indium tin oxide from the bottom. Thereafter, the first member layer 41A is formed on the first electrode 21 using chemical vapor deposition (CVD) or the like. The first member layer 41A is a layer on which the first member 41 is formed by being patterned by etching in a later stage, and may contain, for example, silicon oxide ($SiO_x$), or the like.

Figure 8:
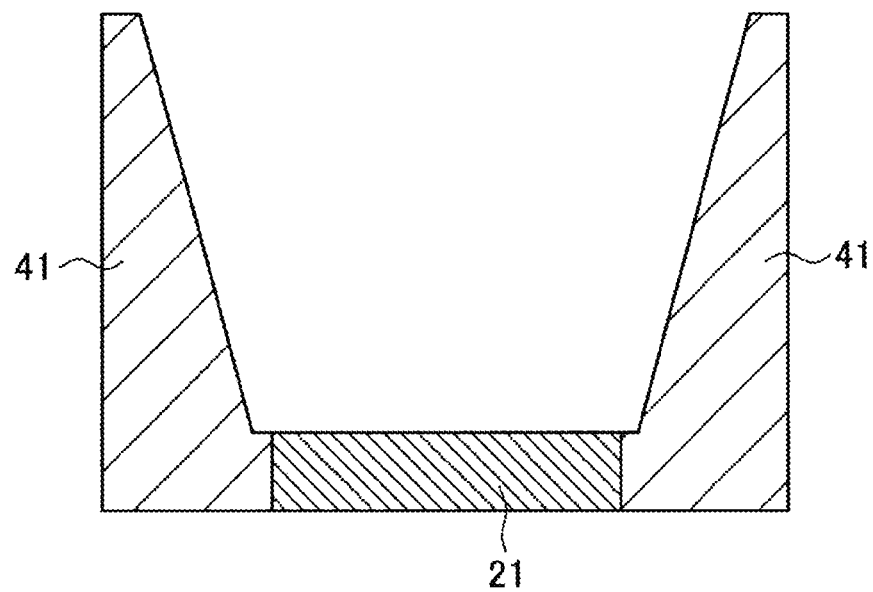
FIG. 8 is a cross sectional view schematically illustrating one step of the method for manufacturing the light emitting element according to the embodiment.

Next, as illustrated in FIG. 8, the first member layer 41A is patterned using etching or the like such that the first electrode 21 is exposed. As a result, a recess structure having the first electrode 21 as a bottom and having the first member 41 as a side wall is formed. Here, the recess structure is preferably formed in a reverse tapered shape in which the opening area of a surface on which the first electrode 21 is disposed is smaller than the opening area of a facing surface by controlling etching conditions.

Figure 9:
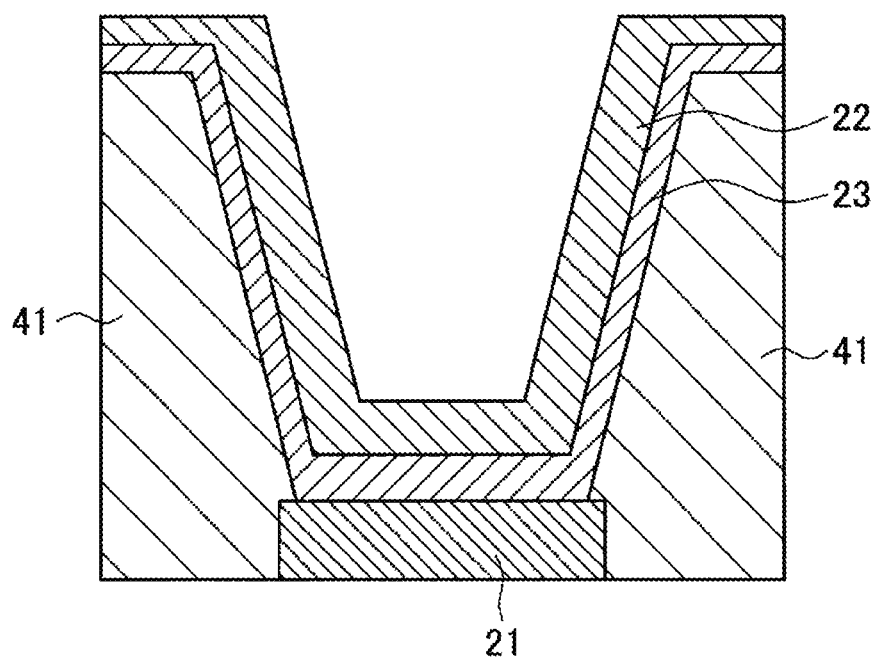
FIG. 9 is a cross sectional view schematically illustrating one step of the method for manufacturing the light emitting element according to the embodiment.

Subsequently, as illustrated in FIG. 9, the organic light emitting layer 23 is formed on the first electrode 21 and the first member 41 along the recess structure, and the second electrode 22 is formed on the light emitting layer 23 along the recess structure.

Specifically, first, using a vacuum vapor deposition method, a hole injection layer, a hole transport layer, a light emitting layer, an electron transport layer, and an electron injection layer are sequentially formed on the first electrode 21 and the first member 41 from the side of the first electrode 21 to form the organic light emitting layer 23. Note that the materials described above can be used for materials of the layers. Thereafter, the second electrode 22 is formed on the organic light emitting layer 23 using sputtering or the like. The second electrode 22 may contain a transparent conductive material such as indium zinc oxide or indium tin oxide.

Figure 10:
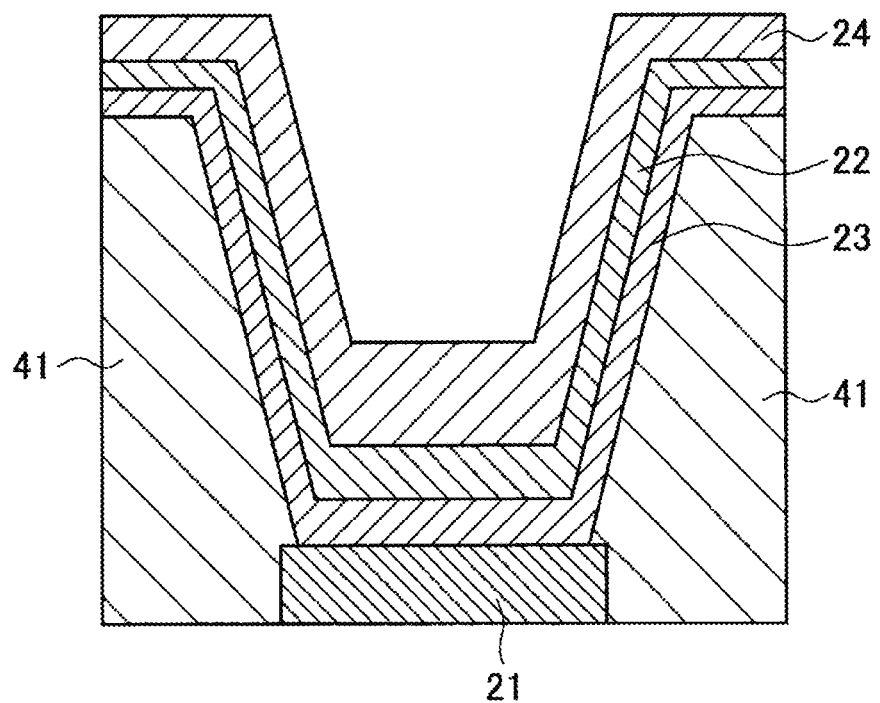
FIG. 10 is a cross sectional view schematically illustrating one step of the method for manufacturing the light emitting element according to the embodiment.

Next, as illustrated in FIG. 10, the barrier layer 24 is formed on the second electrode 22.

Specifically, the barrier layer 24 is formed as a laminate of a plurality of layers having different refractive indices by using CVD, sputtering, atomic layer deposition (ALD), or ion plating. For example, the barrier layer 24 may be formed as a laminate obtained by alternately and repeatedly laminating $Al_2O_3$ and $TiO_2$ on the order of nanometers using ALD. However, the barrier layer 24 is formed such that the refractive index of the entire barrier layer 24 is an intermediate value between the refractive index of the second electrode 22 and the refractive index of the second member 42.

Figure 11:
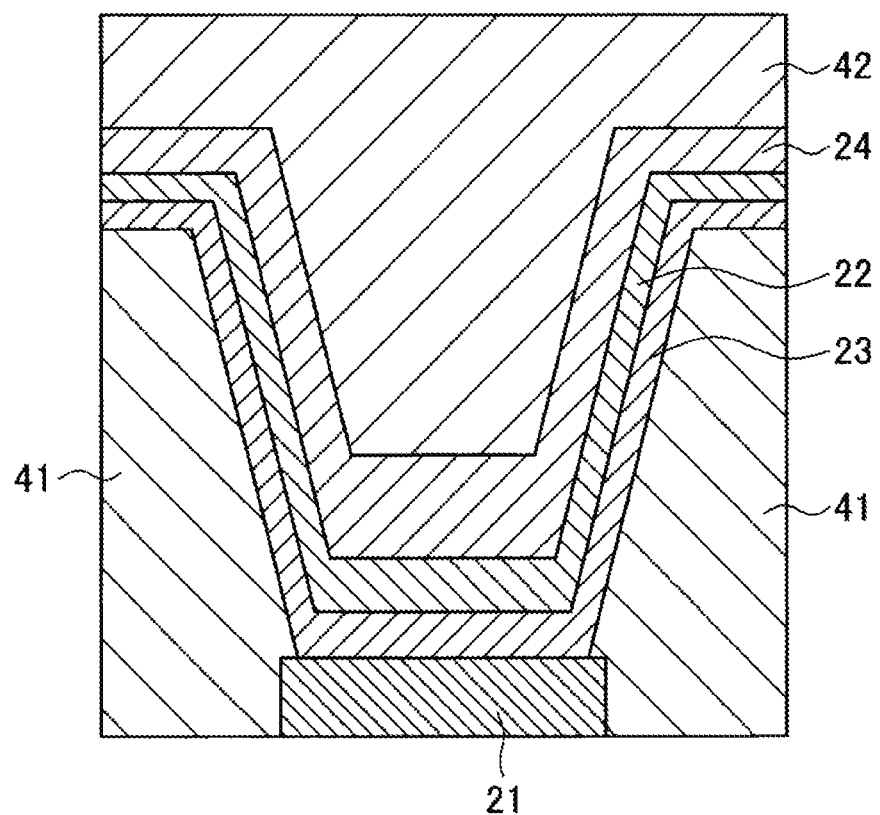
FIG. 11 is a cross sectional view schematically illustrating one step of the method for manufacturing the light emitting element according to the embodiment.

Subsequently, as illustrated in FIG. 11, the second member 42 is formed on the barrier layer 24 so as to embed the recess structure formed by the first member 41.

Specifically, the second member 42 can be formed so as to embed the recess structure on the barrier layer 24 by using a spin coating method or the like. Alternatively, after the second member 42 is formed on the entire surface of the barrier layer 24, by removing the second member 42 formed outside the interior of the recess structure using CMP or etch back, the second member 42 can be formed. For example, the second member 42 may contain an acrylic resin dispersely containing a filler containing $TiO_2$ or $ZrO_2$.

Moreover, after the color filter layer 33 is disposed on the second member 42, by bonding the first substrate 11 on which the light emitting element 10 is formed and the second substrate 34, the display device 1 is formed. The light emitting element 10 and the display device 1 according to the present embodiment can be manufactured through such steps. Note that the above manufacturing method is merely an example, and the method for manufacturing the light emitting element 10 and the display device 1 according to the present embodiment is not limited to the above.

<5. Application Example>

Subsequently, an application example of the light emitting element 10 according to an embodiment of the present disclosure will be described with reference to FIGS. 12 to 15. Each of FIGS. 12 to 15 is an external view illustrating an example of a display device or an electronic apparatus to which the light emitting element 10 according to an embodiment of the present disclosure can be applied.

Figure 12:
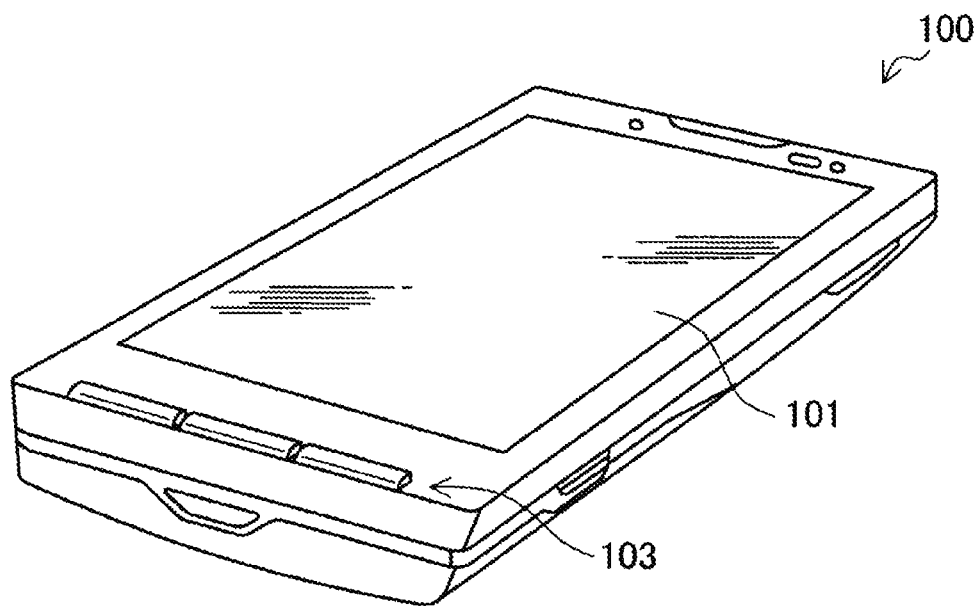
FIG. 12 is an external view illustrating an example of a display device or an electronic apparatus to which a light emitting element according to an embodiment of the present disclosure can be applied.

For example, the light emitting element 10 according to the present embodiment can be applied to a pixel element of a display unit included in an electronic apparatus such as a smartphone. Specifically, as illustrated in FIG. 12, a smartphone 100 includes a display unit 101 that displays various types of information, and an operation unit 103 including a button or the like that receives an operation input by a user. Here, the display unit 101 may include the light emitting element 10 according to the present embodiment, and may be formed as the display device 1 according to the present embodiment.

Figure 13:
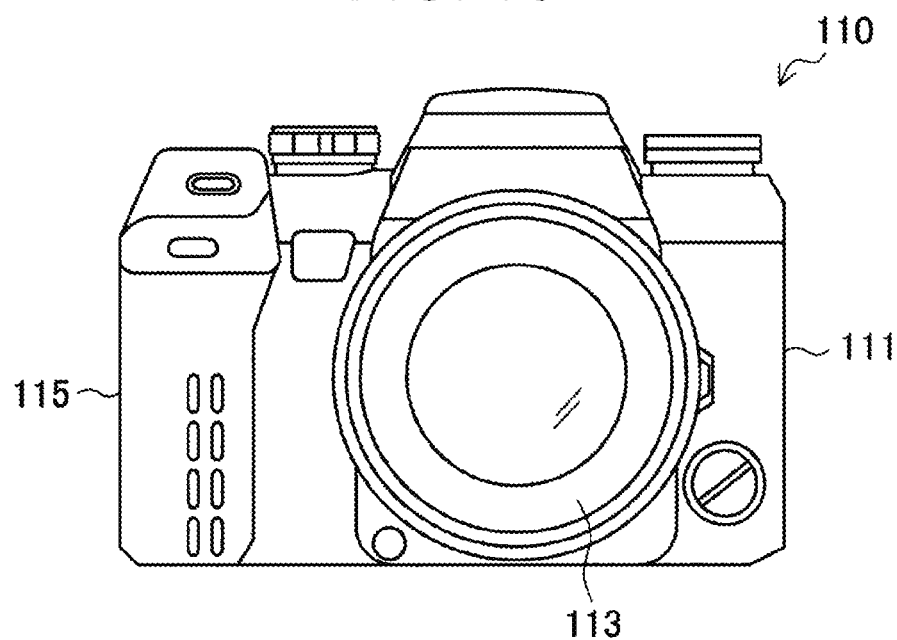
FIG. 13 is an external view illustrating another example of the display device or the electronic apparatus to which the light emitting element according to the embodiment can be applied.
Figure 14:
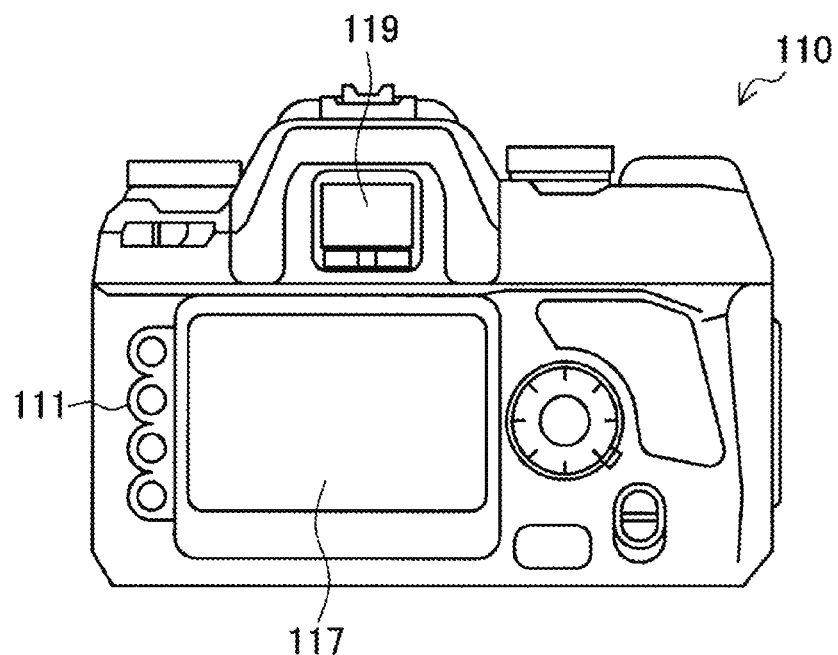
FIG. 14 is an external view illustrating another example of the display device or the electronic apparatus to which the light emitting element according to the embodiment can be applied.

Furthermore, for example, the light emitting element 10 according to the present embodiment can be applied to a pixel element of a display unit of an electronic apparatus such as a digital camera. Specifically, as illustrated in FIGS. 13 and 14, a digital camera 110 includes a main body (camera body) 111, an interchangeable lens unit 113, a grip unit 115 held by a user at the tome of photographing, a monitor unit 117 that displays various types of information, and an electronic view finder (EVF) 119 that displays a through image observed by a user at the time of photographing. Note that FIG. 13 illustrates an external appearance of the digital camera 110 viewed from the front (in other words, an object side), and FIG. 14 illustrates an external appearance of the digital camera 110 viewed from the rear (in other words, a photographer side). Here, the monitor unit 117 and the EVF 119 may each include the light emitting element 10 according to the present embodiment, and may be formed as the display device 1 according to the present embodiment.

Figure 15:
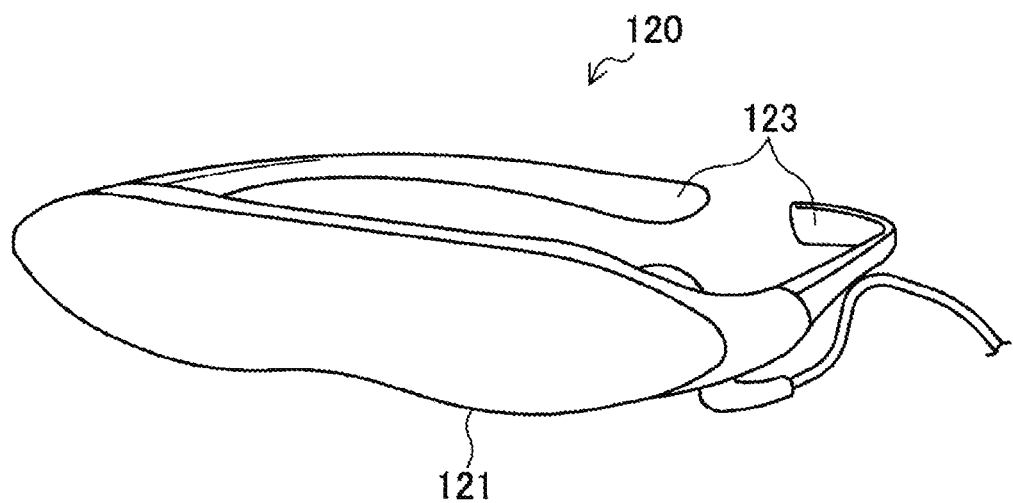
FIG. 15 is an external view illustrating another example of the display device or the electronic apparatus to which the light emitting element according to the embodiment can be applied.

Furthermore, for example, the light emitting element 10 according to the present embodiment can be applied to a display unit of an electronic apparatus such as a head mounted display (HMD). Specifically, as illustrated in FIG. 15, an HMD 120 includes an eyeglass type display unit 121 that displays various types of information, and an ear hooking unit 123 to be hooked on a user's ear at the time of being worn. Here, the display unit 121 may include the light emitting element 10 according to the present embodiment, or may be formed as the display device 1 according to the present embodiment.

Note that the electronic apparatus to which the light emitting element 10 according to the present embodiment can be applied is not limited to the above examples. The light emitting element 10 according to the present embodiment can be applied to a display unit of an electronic apparatus in any field that performs display on the basis of an image signal input from the outside or an image signal generated internally. Examples of such an electronic apparatus include a television device, an electronic book, a personal digital assistant (PDA), a laptop personal computer, a video camera, a game device, and the like.

Hitherto, preferable embodiments of the present disclosure have been described in detail with reference to the accompanying drawings, but the technical scope of the present disclosure is not limited to such examples. It is obvious that a person having ordinary knowledge in the technical field to which the present disclosure belongs can conceive of various change examples and modification examples within a range of the technical idea described in the claims, and it is understood that these change examples and modification examples are naturally within the technical scope of the present disclosure.

In the above, the display device and the electronic apparatus using an organic EL element as a light emitting element have been described as an embodiment of the present disclosure, but the present disclosure is not limited to such an example. The display device to which the present disclosure is applied may be any display device capable of achieving color display, such as a liquid crystal display, a plasma display, or electronic paper. Also in these other display devices, by forming the barrier layer as a laminate so as to prevent unintended reflection of light and controlling the refractive index of the barrier layer, it is possible to obtain an effect of improving light extracting efficiency from the light emitting element as in the above-described embodiment.

Here, the light emitting element refers to a portion that emits light toward the outside in each pixel of the display device. For example, in the case of the display device described in the above embodiment, the light emitting element corresponds to the organic light emitting layer (in other words, organic EL element) sandwiched between the lower electrode and the upper electrode. Furthermore, in a case of a liquid crystal display, the light emitting element corresponds to one pixel of a liquid crystal panel including a backlight. Moreover, in a case of a plasma display, the light emitting element corresponds to one discharge cell of a plasma display panel.

Furthermore, the effects described in the present specification are merely illustrative or exemplary, and are not limiting. That is, the technique according to the present disclosure can exhibit another effect obvious to those skilled in the art from the description of the present specification together with the above effect or in place of the above effect.

Note that the following configurations are also within the technical scope of the present disclosure.

(1)

A light emitting element including:

a first electrode;

a first member disposed on both sides of the first electrode and forming a recess structure having the first electrode as a bottom;

an organic light emitting layer including an organic light emitting material and disposed along the recess structure on the first electrode and the first member;

a second electrode disposed on the organic light emitting layer; and a second member having a higher refractive index than the first member and disposed on the second electrode so as to embed the recess structure, in which between the second electrode and the second member, a barrier layer formed as a laminate of a plurality of layers having different refractive indices and having, as the entire laminate, a refractive index between the refractive index of the second electrode and the refractive index of the second member is disposed.

(2)

The light emitting element according to (1), in which the laminate is obtained by laminating two types of layers repeatedly and alternately.

(3)

The light emitting element according to (2), in which at least one of the two types of layers has a film thickness of 10 nm or less.

(4)

The light emitting element according to (2) or (3), in which a total film thickness of a repeating unit including the two types of layers is 24 nm or less.

(5)

The light emitting element according to any one of (2) to (4), in which a difference in refractive index between the two types of layers is 0.1 or more.

(6)

The light emitting element according to (1), in which the laminate is obtained by laminating three or more types of layers.

(7)

The light emitting element according to any one of (1) to (6), in which the laminate is formed by laminating a plurality of types of inorganic materials containing different types of elements.

(8)

The light emitting element according to (7), in which at least one of the inorganic materials is a metal oxide.

(9)

The light emitting element according to (8), is which the metal oxide is any one of $TiO_2$, $ZrO_2$, ZnO, $Ta_2O_5$, $HfO_2$, and $Nb_2O_5$.

(10)

A display device including:

a display unit having a plurality of light emitting elements arranged on a plane, each of the light emitting elements including: a first electrode; a first member disposed on both sides of the first electrode and forming a recess structure having the first electrode as a bottom; an organic light emitting layer including an organic light emitting material and disposed along the recess structure on the first electrode and the first member; a second electrode disposed on the organic light emitting layer; and a second member having a higher refractive index than the first member and disposed on the second electrode so as to embed the recess structure, in which between the second electrode and the second member, a barrier layer formed as a laminate of a plurality of layers having different refractive indices and having, as the entire laminate, a refractive index between the refractive index of the second electrode and the refractive index of the second member is disposed; and a display control unit that controls the display unit.

(11)

An electronic apparatus including:

a display unit having a plurality of light emitting elements arranged on a plane, each of the light emitting elements including: a first electrode; a first member disposed on both sides of the first electrode and forming a recess structure having the first electrode as a bottom; an organic light emitting layer including an organic light emitting material and disposed along the recess structure on the first electrode and the first member; a second electrode disposed on the organic light emitting layer; and a second member having a higher refractive index than the first member and disposed on the second electrode so as to embed the recess structure, in which between the second electrode and the second member, a barrier layer formed as a laminate of a plurality of layers having different refractive indices and having, as the entire laminate, a refractive index between the refractive index of the second electrode and the refractive index of the second member is disposed; and a control unit that controls the display unit.

REFERENCE SIGNS LIST

1 Display device
10 Light emitting element
21 First electrode
22 Second electrode
23 Organic light emitting layer
24 24 Barrier layer
41 First member
42 Second member
241 Protective layer
242 Refractive index adjusting layer

The invention claimed is:

1. A light emitting element comprising:

a first electrode;

a first member disposed on both sides of the first electrode and forming a recess structure having the first electrode as a bottom;

an organic light emitting layer including an organic light emitting material and disposed along the recess structure on the first electrode and the first member;

a second electrode disposed on the organic light emitting layer; and a second member having a higher refractive index than the first member and disposed on the second electrode so as to embed the recess structure, wherein between the second electrode and the second member, a barrier layer formed as a laminate of a plurality of layers having different refractive indices and having, as the entire laminate, a refractive index between the refractive index of the second electrode and the refractive index of the second member is disposed.

2. The light emitting element according to claim 1, wherein the laminate is obtained by laminating two types of layers repeatedly and alternately.

3. The light emitting element according to claim 2, wherein at least one of the two types of layers has a film thickness of 10 nm or less.

4. The light emitting element according to claim 2, wherein a total film thickness of a repeating unit including the two types of layers is 24 nm or less.

5. The light emitting element according to claim 2, wherein a difference in refractive index between the two types of layers is 0.1 or more.

6. The light emitting element according to claim 1, wherein the laminate is obtained by laminating three or more types of layers.

7. The light emitting element according to claim 1, wherein the laminate is formed by laminating a plurality of types of inorganic materials containing different types of elements.

8. The light emitting element according to claim 7, wherein at least one of the inorganic materials is a metal oxide.

9. The light emitting element according to claim 8, wherein the metal oxide is any one of $TiO_2$, $ZrO_2$, ZnO, $Ta_2O_5$, $HfO_2$, and $Nb_2O_5$.

10. A display device comprising:

a display unit having a plurality of light emitting elements arranged on a plane, each of the light emitting elements including: a first electrode; a first member disposed on both sides of the first electrode and forming a recess structure having the first electrode as a bottom; an organic light emitting layer including an organic light emitting material and disposed along the recess structure on the first electrode and the first member; a second electrode disposed on the organic light emitting layer; and a second member having a higher refractive index than the first member and disposed on the second electrode so as to embed the recess structure, in which between the second electrode and the second member, a barrier layer formed as a laminate of a plurality of layers having different refractive indices and having, as the entire laminate, a refractive index between the refractive index of the second electrode and the refractive index of the second member is disposed; and a display control unit that controls the display unit.

11. An electronic apparatus comprising:

a display unit having a plurality of light emitting elements arranged on a plane, each of the light emitting elements including: a first electrode; a first member disposed on both sides of the first electrode and forming a recess structure having the first electrode as a bottom; an organic light emitting layer including an organic light emitting material and disposed along the recess structure on the first electrode and the first member; a second electrode disposed on the organic light emitting layer; and a second member having a higher refractive index than the first member and disposed on the second electrode so as to embed the recess structure, in which between the second electrode and the second member, a barrier layer formed as a laminate of a plurality of layers having different refractive indices and having, as the entire laminate, a refractive index between the refractive index of the second electrode and the refractive index of the second member is disposed; and a control unit that controls the display unit.

* * * * *